(12) United States Patent
Eisert et al.

(10) Patent No.: US 8,330,175 B2
(45) Date of Patent: Dec. 11, 2012

(54) ELECTROMAGNETIC RADIATION GENERATING SEMICONDUCTOR CHIP AND METHOD FOR MAKING SAME

(75) Inventors: Dominik Eisert, Regensburg (DE); Uwe Strauss, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 1501 days.

(21) Appl. No.: 11/154,292

(22) Filed: Jun. 16, 2005

(65) Prior Publication Data

US 2006/0011923 A1     Jan. 19, 2006

(30) Foreign Application Priority Data

Jun. 30, 2004   (DE) .................... 10 2004 031 853
Mar. 24, 2005   (DE) .................... 10 2005 013 894

(51) Int. Cl.
*H01L 33/22* (2010.01)

(52) U.S. Cl. .................. 257/98; 257/79; 257/E33.001; 257/E33.055; 257/E33.067; 257/E33.068; 257/E33.074; 438/22; 438/29

(58) Field of Classification Search .............. 257/98, 257/E33.068, 79, E33.001, E33.055, E33.067, 257/E33.074; 438/29, 22

See application file for complete search history.

(56) References Cited

U.S. PATENT DOCUMENTS

| | | | | |
|---|---|---|---|---|
| 5,040,044 A | * | 8/1991 | Noguchi et al. | 257/103 |
| 5,693,963 A | * | 12/1997 | Fujimoto et al. | 257/94 |
| 5,779,924 A | * | 7/1998 | Krames et al. | 216/24 |
| 5,793,062 A | | 8/1998 | Kish, Jr. et al. | |
| 5,900,650 A | * | 5/1999 | Nitta | 257/94 |
| 6,015,719 A | | 1/2000 | Kish, Jr. et al. | |
| 6,441,403 B1 | | 8/2002 | Chang et al. | |
| 6,690,035 B1 | * | 2/2004 | Yokogawa et al. | 257/77 |
| 6,784,463 B2 | * | 8/2004 | Camras et al. | 257/99 |
| 6,794,684 B2 | * | 9/2004 | Slater et al. | 257/77 |
| 6,821,804 B2 | * | 11/2004 | Thibeault et al. | 438/29 |
| 6,940,099 B2 | * | 9/2005 | Hata et al. | 257/98 |
| 2002/0141006 A1 | * | 10/2002 | Pocius et al. | 359/15 |

(Continued)

FOREIGN PATENT DOCUMENTS

DE         101 07 472         12/2001

(Continued)

OTHER PUBLICATIONS

Jang et al., "Low-resistance, high-transparency, and thermally stable ohmic contacts on p-type GaN using Ru and Ir", *International Workshop on Nitride Semiconductors, Book of Abstracts*, Jul. 22-25, 2002, pp. 262.

(Continued)

*Primary Examiner* — Matthew E Warren
*Assistant Examiner* — John Lin
(74) *Attorney, Agent, or Firm* — Fish & Richardson P.C.

(57) ABSTRACT

An electromagnetic radiation generating semiconductor chip is disclosed. A semiconductor layer sequence suitable for generating electromagnetic radiation is grown on a first main face of a radioparent, electrically conductive growth substrate, for example, a SiC growth substrate. Provided on a second main face of said growth substrate that faces away from said semiconductor layer sequence is a roughening that acts as a diffuser for an electromagnetic radiation emitted into said growth substrate by said semiconductor layer sequence and that in particular has a scattering factor higher than 0.25. A layer or layer sequence reflective of the electromagnetic radiation is applied to said roughening. A method for making the semiconductor chip is also disclosed.

34 Claims, 5 Drawing Sheets

U.S. PATENT DOCUMENTS

| | | | |
|---|---|---|---|
| 2002/0195609 A1* | 12/2002 | Yoshitake et al. | 257/81 |
| 2002/0197764 A1* | 12/2002 | Uemura et al. | 438/79 |
| 2003/0111667 A1* | 6/2003 | Schubert | 257/98 |
| 2003/0164502 A1 | 9/2003 | Baur et al. | 257/78 |
| 2004/0119082 A1 | 6/2004 | Sugawara | |
| 2004/0256632 A1 | 12/2004 | Stein et al. | 257/103 |

FOREIGN PATENT DOCUMENTS

| | | |
|---|---|---|
| DE | 103 50 707 | 11/2004 |
| EP | 1 378 949 | 1/2004 |
| WO | WO 01/39282 | 5/2001 |
| WO | WO 01/84640 | 11/2001 |
| WO | WO 01/91195 | 11/2001 |

OTHER PUBLICATIONS

Kaminska et al., "Electrical Properties and Microstructure of Transparent ZnO Contacts to GaN", *International Workshop on Nitride Semiconductors, Book of Abstracts*, Jul. 22-25, 2002, pp. 263.

Kim et al., "Transparent ohmic contacts on p-GaN using indium tin oxide overlayer", *International Workshop on Nitride Semiconductors, Book of Abstracts*, Jul. 22-25, 2002, pp. 257.

Zemax, Optical Design Program, User's Guide, Version: Jul. 2002.

\* cited by examiner

ELECTROMAGNETIC RADIATION GENERATING SEMICONDUCTOR CHIP AND METHOD FOR MAKING SAME

CROSS REFERENCE TO RELATED APPLICATIONS

Pursuant to 35 U.S.C. §119, this application claims the benefit of German Application No. 10 2004 031 853.0, filed Jun. 30, 2004, and German Application No. 10 2005 013 894.2, filed Mar. 24, 2005. The contents of the prior applications are incorporated herein by reference in their entirety.

FIELD OF THE INVENTION

The invention relates to an electromagnetic radiation generating semiconductor chip and to a method for making such a semiconductor chip.

BACKGROUND OF THE INVENTION

Semiconductor chips, such as light-emitting diodes (LEDs), are used to emit electromagnetic radiation. In some cases, a semiconductor layer sequence suitable for generating the electromagnetic radiation is a grown on a first main face of a radioparent, electrically conductive growth substrate, such as a silicon carbide (SiC) substrate.

SUMMARY OF THE INVENTION

In one aspect, an electromagnetic radiation generating semiconductor chip is disclosed that includes a semiconductor layer sequence suitable for generating electromagnetic radiation is grown on a first main face of a radioparent, electrically conductive growth substrate. Provided on a second main face of the growth substrate that faces away from the semiconductor layer sequence is a roughening that is suitable for acting as a diffuser for electromagnetic radiation emitted into the growth substrate from the semiconductor layer sequence. This roughening preferably has a scattering factor greater than 0.25. Applied to the roughening, in turn, is a layer that is reflective of the electromagnetic radiation.

Embodiments of the semiconductor chip may include any of the following features.

The growth substrate preferably has a thickness of between 50 μm inclusive and 150 μm inclusive, particularly preferably of about 100 μm.

The semiconductor layer sequence can be based on nitride compound semiconductor material.

For example, the group of radiation emitting semiconductor structures based on nitride III/V compound semiconductor material includes in particular, in the present context, any semiconductor structure, suitable for a radiation emitting semiconductor component, that comprises a layer sequence composed of different individual layers and that includes at least one individual layer comprising a nitride III/V compound semiconductor material, preferably from the nitride III/V compound semiconductor material system $In_xAl_yGa_{1-x-y}N$, where $0 \leq x \leq 1$, $0 \leq y \leq 1$ and $x+y \leq 1$. This naturally does not preclude the presence in the composition of additional elements besides In, Al and/or Ga and N. Such a semiconductor structure can comprise, for example, a conventional pn junction, a double heterostructure, a single quantum well structure (SQW structure) or a multiple quantum well structure (MQW structure). Structures of these kinds are known to the skilled person and thus will not be described in more detail here. Suitable radiation emitting semiconductor layer sequences based on nitride III/V compound semiconductor material are described, for example, in WO 01/39282 A2, the contents of which are incorporated herein by reference.

The growth substrate is preferably a SiC growth substrate. Adjacent the reflective layer can be implanted a dopant, for example nitrogen, which there increases the majority charge carrier density and leads to higher electrical conductivity. The reflective, electrically connecting layer can then be deposited afterwards.

The reflective layer advantageously contains a metal that is highly reflective of an electromagnetic radiation emitted by the electromagnetic radiation generating semiconductor layer sequence during electrical operation. Particularly in the case of radiation emitting semiconductor structures based on nitride III/V compound semiconductor material, the metal preferably contains Al, Ag, Ru and/or Ir or consists of one or more of these elements.

In a particularly advantageous embodiment, the roughening is a diffuse roughening of the second main face of the growth substrate. The second main face is preferably provided with a pyramid structure to produce the roughening.

Alternatively, or in addition, to the growth substrate, the electromagnetic radiation generating semiconductor layer sequence can in particular be roughened on the side facing away from the growth substrate.

In another aspect, where a flip-chip assembly is intended (for example, in which, in an LED housing, the electromagnetic radiation generating semiconductor layer sequence, viewed from the growth substrate, is disposed facing a chip mounting surface of the LED housing), the electromagnetic radiation generating semiconductor layer sequence can be roughened on the side facing away from the growth substrate and provided there with a reflective layer. Here, the roughening of the semiconductor layer sequence acts as a diffuser for an electromagnetic radiation emitted to this main face by the semiconductor layer sequence and has in particular a scattering factor that is higher than 0.25. In this case, the second main face of the growth substrate is not provided with a reflective layer. The side of the growth substrate facing away from the semiconductor layer sequence can be roughened in addition to, or alternatively to, the roughening of the semiconductor layer sequence.

Instead of the second main face, a front side facing away from the reflective layer or layer sequence and through which the semiconductor chip emits electromagnetic radiation when operating can present a roughening, and the reflective layer or layer sequence can be applied to a non-roughened second main face.

In an advantageous configuration of the semiconductor chip, a transparent or semitransparent, electrically conductive front-side contact layer is disposed on the front side that faces away from the reflective layer or layer sequence and through which the semiconductor chip emits electromagnetic radiation when operating.

The ratio of the area of the main face of the growth substrate provided with the reflective layer, and thus of the semiconductor layer sequence, that is reflectively coated by means of said reflective layer to the non-reflectively-coated area thereof is greater than 50%, and preferably greater than 90%.

In another aspect, the invention features a method for making a semiconductor chip. After the electromagnetic radiation generating semiconductor layer sequence has been grown on the growth substrate, the transparent or semitransparent, electrically conductive front-side contact layer is applied to the electromagnetic radiation generating semiconductor layer sequence. Mesas are then formed in the electromagnetic radiation generating semiconductor layer sequence before the growth substrate is later thinned. After the thinning of the growth substrate, its second main face is roughened and a reflective layer or a reflective layer sequence is applied thereto.

In an alternative method for making a semiconductor chip, after the growth of the electromagnetic radiation generating semiconductor layer sequence on the growth substrate, the main face of the semiconductor layer sequence, facing away from the growth substrate, is roughened and the reflective layer or layer sequence is applied to this roughened face. Mesas are then formed in the electromagnetic radiation generating semiconductor layer sequence, before the growth substrate is then thinned. A transparent or semitransparent, electrically conductive front-side contact layer is subsequently applied to the electromagnetic radiation generating semiconductor layer sequence.

In an advantageous embodiment of the method, a bonding pad is disposed on the transparent or semitransparent, electrically conductive front-side contact layer before the thinning of the growth substrate. A passivation layer can also advantageously be applied to the mesas before the thinning of the growth substrate.

The roughening can be effected by means of a laser process or by means of a wet chemical etching process or by means of a dry etching process.

The transparent or semitransparent, electrically conductive front-side contact layer can advantageously comprise a radioparent first metal layer and a second metal layer disposed thereafter, viewed from the semiconductor layer sequence, the first metal layer being applied to the semiconductor layer sequence over substantially its entire area and the second metal layer being retracted with respect to the edges of the first metal layer. In one advantageous embodiment, the first metal layer is a Pt layer or a Pt-based layer and the second metal layer is an Au layer or an Au-based layer.

In an alternative embodiment, the transparent or semitransparent, electrically conductive front-side contact layer can advantageously be an indium/tin layer and/or a zinc oxide layer.

Particularly preferably, the thickness of the growth substrate after thinning is smaller than an edge length of the semiconductor chip.

In preferred embodiments, the semiconductor chip provides an optimized brightness, and the method produces such chips.

The details of one or more embodiments of the invention are set forth in the accompanying drawings and the description below. Other aspects, features, and advantages follow.

BRIEF DESCRIPTION OF THE DRAWINGS

The invention will be described in more detail below with reference to exemplary embodiments in conjunction with FIGS. 1 to 8.

In the various exemplary embodiments, like and like-acting elements are provided with the same respective reference numerals. The figures are not strictly true to scale, and the layer thickness ratios depicted therein do not strictly correspond to the actual layer thickness ratios.

DETAILED DESCRIPTION OF THE INVENTION

Figure 1:
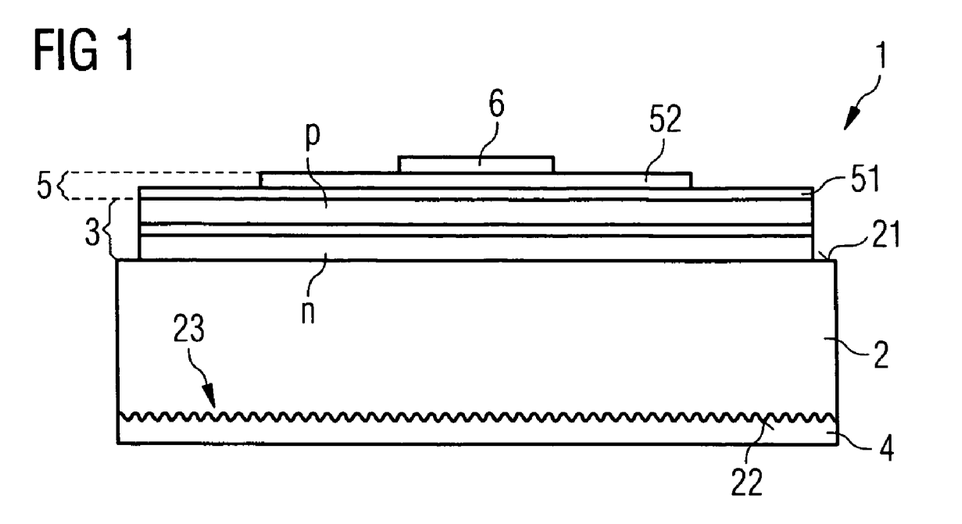
FIG. 1 is a schematic diagram of a section through an exemplary embodiment of a semiconductor chip.

The exemplary embodiment according to FIG. 1 (layer sequence I) is an electromagnetic radiation generating semiconductor chip 1 in which an electromagnetic radiation generating semiconductor layer sequence 3 is grown on a first main face 21 of a radioparent, electrically conductive growth substrate 2. Growth substrate 2 is composed, for example, of SiC and the semiconductor layer sequence is, for example, a radiation emitting semiconductor structure based on nitride III/V compound semiconductor material applied to the growth substrate by metalorganic gas phase epitaxy. One example of a suitable radiation emitting semiconductor structure based on nitride III/V compound semiconductor material is described, for example, in WO 01/39282 A2.

Provided on a main face 22 of growth substrate 2 that faces away from semiconductor layer sequence 3 is a roughening 23 that acts as a diffuser for an electromagnetic radiation emitted into the growth substrate by semiconductor layer sequence 3 and that preferably has a scattering factor higher than 0.25. The roughening is produced, for example, by means of a laser process or by means of a wet chemical etching process or a dry etching process.

Applied to the roughening 23 is a layer 4 (the term "layer" in this context also includes a reflective layer sequence) that is reflective of the electromagnetic radiation. This reflective layer 4 contains a metal that is highly reflective of an electromagnetic radiation emitted by electromagnetic radiation generating semiconductor layer sequence 3. In the case of a radiation emitting semiconductor layer sequence based on nitride III/V compound semiconductor material, reflective layer 4 preferably contains at least one of the metals Al, Ag, Ru and Ir.

Reflective layer 4 preferably comprises a partial electrical contact layer for contacting the growth substrate, e.g. in the form of spaced-apart lands (e.g. 10-20 µm wide) or individual dots or in the form of a lattice-like structure, and a reflective layer with which the partial electrical contact layer and additionally at least a portion of the side of growth substrate 2 that faces semiconductor layer sequence 3 are coated.

Growth substrate 2 has a thickness that is between 50 µm inclusive and 150 µm inclusive, preferably about 100 µm.

Particularly preferably, the n-dopant concentration in the SiC growth substrate is greater than or equal to $1 \cdot 10^{17}$ cm$^{-3}$.

Adjacently to reflective layer 4, growth substrate 2 can be implanted with a dopant, for example nitrogen, which there increases the majority charge carrier density and leads to increased electrical conductivity. A reflective electrically connecting layer can then be deposited.

The roughening of the second main face of the growth substrate is preferably a diffuse roughening.

Figure 8:
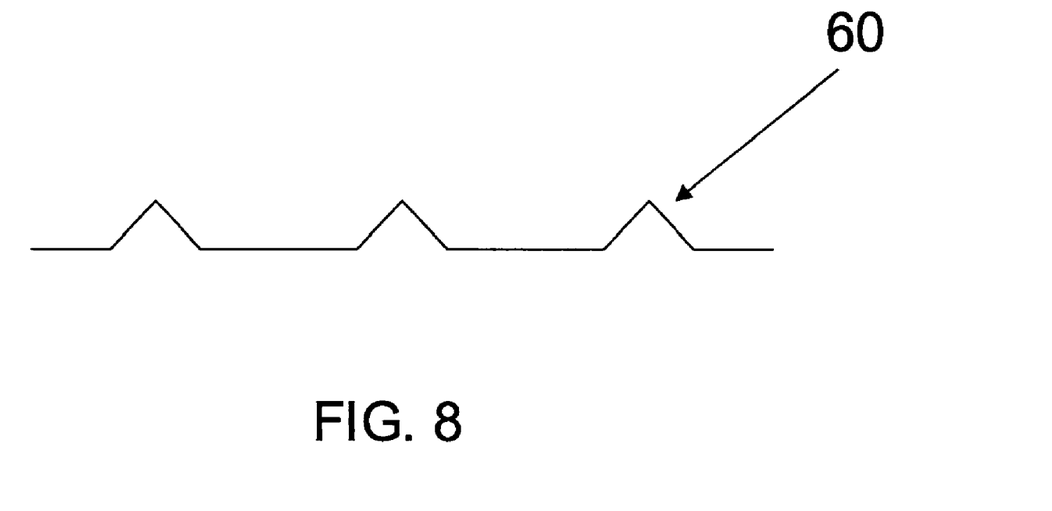
FIG. 8 is a schematic diagram of a pyramid structure.

The second main face can be provided with a pyramid structure 60 as shown in FIG. 8 to roughen it.

Applied to the front side of semiconductor layer sequence 3 that faces away from growth substrate 2 is a transparent or semitransparent, electrically conductive front-side contact layer 5. This comprises, for example, a radioparent first metal layer and a second metal layer disposed thereafter, viewed from the semiconductor layer sequence, the first metal layer being applied to the semiconductor layer sequence over substantially its entire area and the second metal layer being retracted with respect to the edges of the first metal layer. The first metal layer is, for example, a Pt layer and the second metal layer an Au layer.

Alternatively or additionally to growth substrate 2, the electromagnetic radiation generating semiconductor layer sequence 3 can in particular be roughened on the side facing away from growth substrate 2.

A method for making a semiconductor chip of the species described above preferably comprises the following method steps:

growing the electromagnetic radiation generating semiconductor layer sequence 3 on the growth substrate 2,
forming a transparent or semitransparent, electrically conductive front-side contact layer 5 on electromagnetic radiation generating semiconductor layer sequence 3,
forming mesas in electromagnetic radiation generating semiconductor layer sequence 3,
thinning growth substrate 2,
roughening the second main face of the growth substrate, and
applying the reflective layer 4 to the second main face of growth substrate 2.

Preferably before the thinning of the growth substrate, a bonding pad 6 is disposed on front-side contact layer 5. Also preferably before the thinning of growth substrate 2, a passivation layer, which can be based on conventional passivation materials such as silicon nitride or silicon oxide, is applied to the mesas.

The transparent or semitransparent, electrically conductive front-side contact layer 5 includes, for example, a radioparent first metal layer 51 and a second metal layer 52 disposed thereafter, viewed from the semiconductor layer sequence, first metal layer 51 being applied to semiconductor layer sequence 3 substantially over its entire area and second metal layer 52 being retracted with respect to the edges of first metal layer 51.

First metal layer 51 is, for example, a thin Pt layer and second metal layer 52 is, for example, an Au layer. An indium/tin layer can alternatively be used for both metal layers 51, 52.

The thickness of the growth substrate after thinning is smaller than an edge length of the semiconductor chip.

Further exemplary embodiments of layer sequences are described below (the order of the various layers is always viewed from the radiation emitting front side to the reflective back side of the chip):

Layer sequence II (cf. FIG. 2)
i) bonding pad 6, containing for example Au and/or Al;
ii) transparent or semitransparent, electrically conductive front-side contact layer 5, for example of indium/tin oxide or zinc oxide;
iii) electromagnetic radiation generating semiconductor layer sequence 3, for example based on nitride III/V compound semiconductor material;
iv) growth substrate 2 (a SiC growth substrate, for example) with a roughened back side (=the side of growth substrate 2 that faces away from electromagnetic radiation generating semiconductor layer sequence 3);
v) partial electrical contact layer 8, e.g. in the form of spaced-apart lands (e.g. 10-20 µm wide) or individual dots or a lattice-like structure;
vi) reflective layer 4, with which the partial electrical contact layer and additionally at least a portion of the side of growth substrate 2 that faces away from semiconductor layer sequence 3 are coated.

Layer sequence III (cf. FIG. 3):
i) bonding pad 6, containing for example Au and/or Al;
ii) transparent or semitransparent, electrically conductive front-side contact layer 5, for example of indium/tin oxide or zinc oxide;
iii) electromagnetic radiation generating semiconductor layer sequence 3, for example based on nitride III/V compound semiconductor material, whose front side (=the side of electromagnetic radiation generating semiconductor layer sequence 3 that faces away from the growth substrate) is roughened;
iv) growth substrate 2 (a SiC growth substrate, for example) with a roughened back side (=the side of growth substrate 2 that faces away from electromagnetic radiation generating semiconductor layer sequence 3);
v) partial electrical contact layer 8, e.g. in the form of spaced-apart lands (e.g. 10-20 µm wide) or individual dots or a lattice-like structure;
vi) reflective layer 4, with which the partial electrical contact layer and additionally at least a portion of the side of growth substrate 2 that faces away from semiconductor layer sequence 3 are coated.

Figure 2:
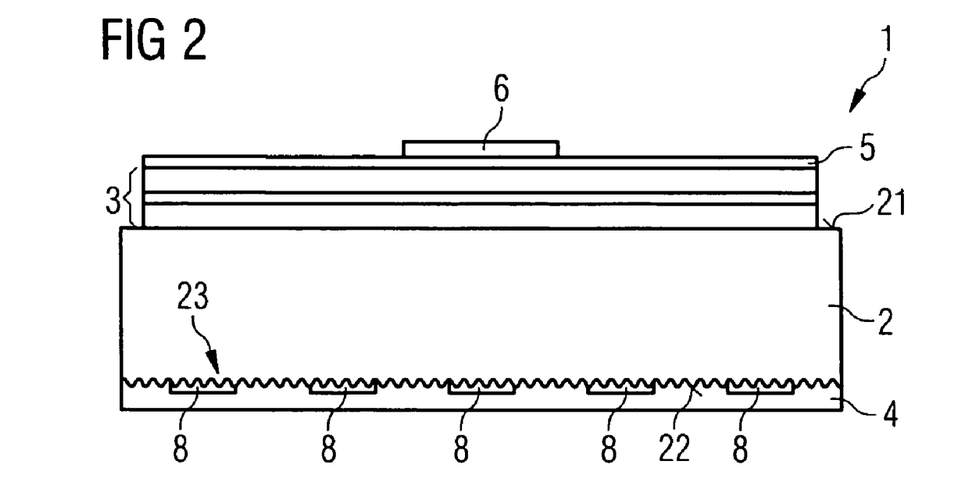
FIG. 2 is a schematic diagram of a section through another exemplary embodiment of a semiconductor chip.
Figure 3:
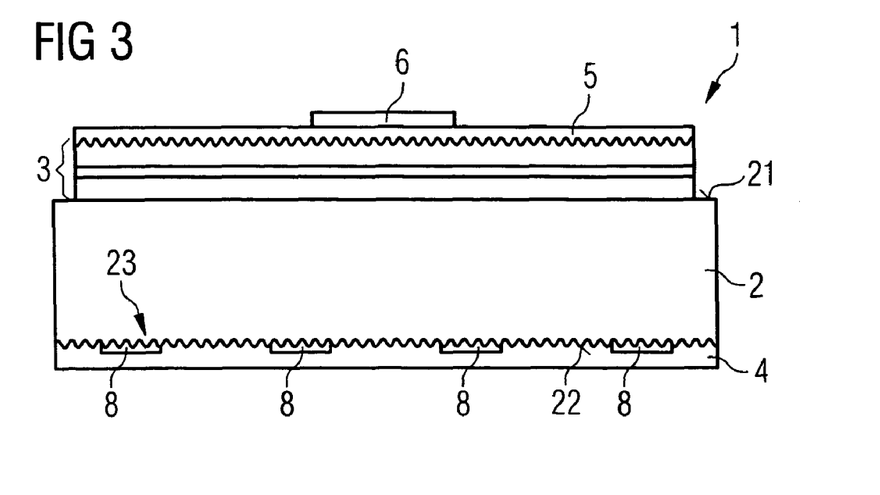
FIG. 3 is a schematic diagram of a section through another exemplary embodiment of a semiconductor chip.

Alternatively, in layer sequences II and III the partial electrical contact layer can be replaced by a thin, semitransparent, for example metallic contact layer, preferably with a thickness of <10 nm, on which reflective layer 4 is then disposed.

In layer sequence III, the roughening of the back side of growth substrate 2 can alternatively be omitted, so that only the front side of the semiconductor layer sequence is roughened.

A particular advantage of layer sequences II and III is the easy mountability of the chip, since it can be mounted with conductive adhesive.

Layer sequence IV (cf. FIG. 4):
i) bonding pad 6;
ii) electrically conductive growth substrate 2 (e.g. a SiC substrate), whose front side 24 facing bonding pad 6 is provided with a roughening;
iii) radiation-generating semiconductor layer sequence 3, for example based on nitride III/V compound semiconductor material;
iv) reflective layer 4, e.g. in the form of spaced-apart lands (e.g. 10-20 µm wide) or individual dots or a lattice-like structure, with which the partial electrical contact layer and additionally at least a portion of the side of growth substrate 2 that faces away from semiconductor layer sequence 3 are coated.

Layer sequence V (cf. FIG. 5):
i) bonding pad 6;
ii) electrically conductive growth substrate 2, e.g. a SiC substrate;
iii) radiation-generating semiconductor layer sequence 3, e.g. based on nitride III/V compound semiconductor material, with a roughened back side 25 (=the face of semiconductor layer sequence 3 that faces away from growth substrate 2);
iv) reflective layer 4, e.g. in the form of spaced-apart lands (e.g. 10-20 µm wide) or individual dots or a lattice-like structure, with which the partial electrical contact layer and additionally at least a portion of the side of semiconductor layer sequence 3 that faces away from semiconductor layer sequence 3 are coated.

Figure 4:
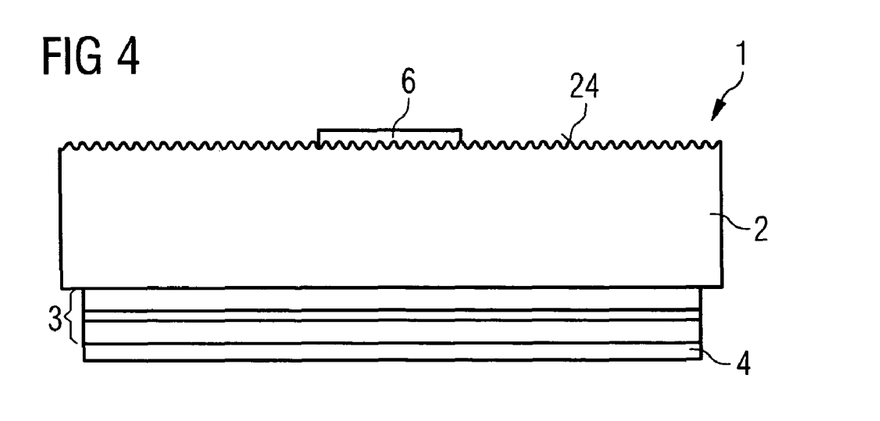
FIG. 4 is a schematic diagram of a section through another exemplary embodiment of a semiconductor chip.
Figure 5:
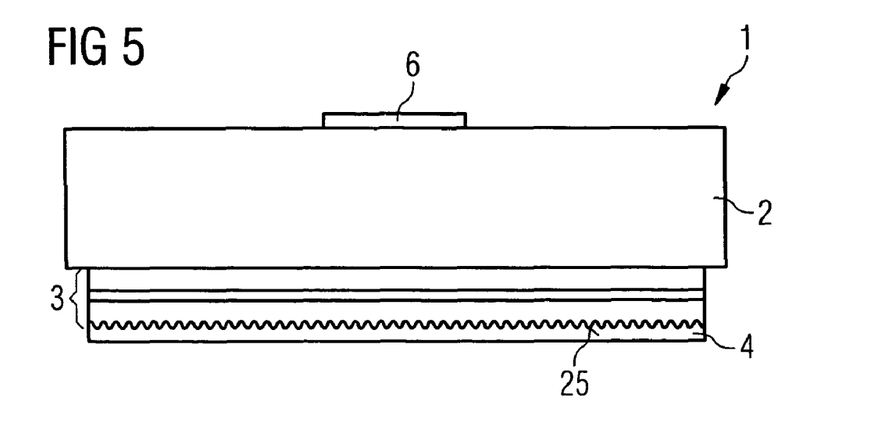
FIG. 5 is a schematic diagram of a section through another exemplary embodiment of a semiconductor chip.

A particular advantage of layer sequences IV and V is improved decoupling of light, since no partially transparent and thus absorbing contact layer is needed on the face of the chip at which the radiation is decoupled.

In the case of layer sequence V according to FIG. 5, the front side (=the side facing away from radiation generating semiconductor layer sequence 3) of growth substrate 2 can additionally be roughened.

The ratio of the area of the particular main face of growth substrate 2 provided with the reflective layer or layer sequence 4, and thus of semiconductor layer sequence 3, that is reflectively coated by means of said reflective layer 4 to the non-reflectively-coated area thereof is greater than 50%, preferably greater than 90%.

In both of the last-cited cases (layer sequences IV and V), in the case of a SiC substrate serving as the growth substrate 2, the bonding pad 6 comprises, for example, a Ni layer and an Au layer. Here, for example the Ni layer is applied to growth substrate 2 and the Au layer is disposed after the Ni layer, viewed from growth substrate 2.

Layer sequences II to V can be produced substantially via method steps that are analogous to the method steps described above in connection with layer sequence I. Only the order of the method steps must be adapted to the specific configuration of the layer sequence desired in each case.

The roughening of the face that is to be roughened in a given exemplary embodiment can be produced by means of a suitable wet chemical etching process and/or by means of a suitable dry etching process and/or by means of a laser process. The wet chemical etchant or dry etchant required in each case depends on the material to be etched. Such etchants are known to those skilled in the art and thus will not be described in more detail here. The same is true of the laser process.

The reflective layers 4 cited in the exemplary embodiments can be composed of, for example, reflective materials, known to those skilled in the art, that are suitable for reflecting layers and for the particular semiconductor material that is to be reflectively coated. For nitride compound semiconductor materials for the reflective layer or layer sequence 4, usable layers or layer sequences that are suitable in practice are described, for example, in the documents WO 01/91195 A1, WO 01/84640 A1 and DE 10350707 A1, whose respective disclosure content in this regard is hereby expressly incorporated by reference.

The same applies to the above-described bonding pad 6 and transparent or semitransparent, electrically conductive front-side contact layer 5.

Radiation emitting semiconductor layer sequences based on nitride III/V compound semiconductor material that are suitable for all of the above-cited layer sequences I to V are described, for example, in WO 01/39282 A2.

With regard to the scattering factor, the distribution of energy into the different angles depends on the kind of roughened surface. For strong scattering media like paper or ceramic materials, the scattered light has a Lambertian characteristics. For surfaces with weaker scattering, the distribution of scattered light is centered about the angle of specular reflectance. It is customary to use simplified mathematical models to describe the angular distribution of scattering from real surfaces.

Figure 6:
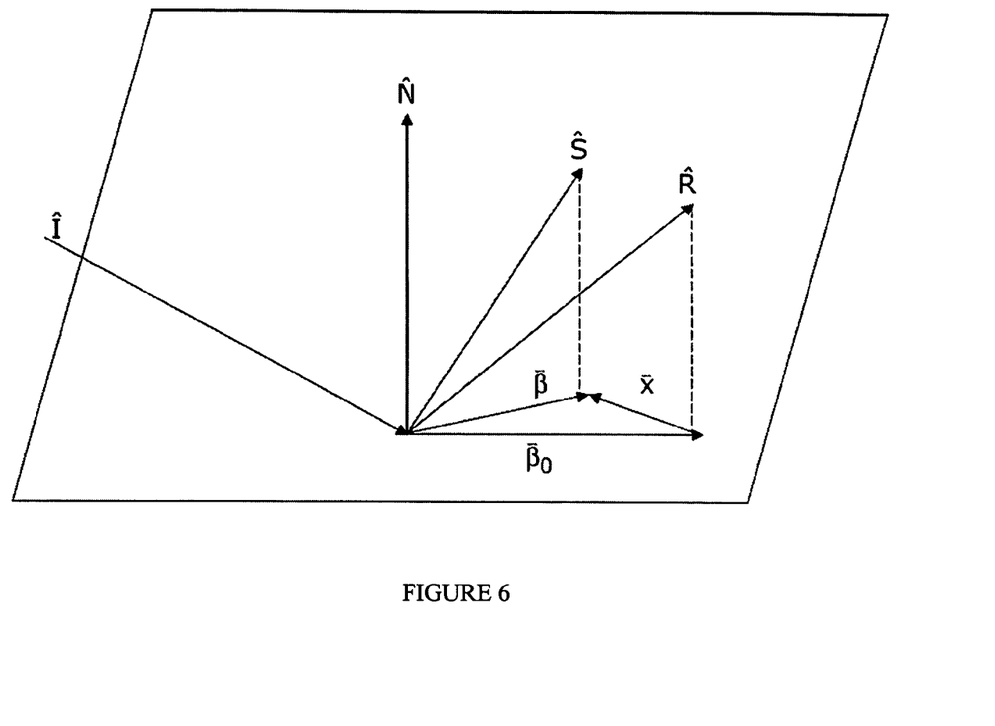
FIG. 6 is a schematic diagram to illustrate the definition of scattering factor, as used herein.

As used herein, the "scattering factor" of a roughened substrate is the sigma-factor $\sigma$ for the best-fit Gaussian distribution to scattering data for the substrate. Specifically, the sigma-factor is the value of $a$ in the expression:

$$P(\vec{x}) = A \cdot \exp\left(-\frac{|\vec{x}|^2}{\sigma^2}\right), \quad (1)$$

where the other parameters in Eq. (1) are described with reference to FIG. 6.

Specifically, referring to FIG. 6, a beam is incident on a surface with direction unit vector $\hat{I}$. For a flat polished surface, the reflected beam, having direction unit vector $\hat{R}$, is specularly reflected, and therefore, has the same angle to the surface normal $\hat{N}$ as the incident beam. If the surface has a certain roughness, there will occur scattered beams, denoted by direction unit vector $\hat{S}$ with an arbitrary angle to the surface normal. The scattering factor for the model above is determined from the distribution of the projections of the scattered beams into the plane of the surface. The projection of the specularly reflected beam and the scattered beam into the plane of the surface are denoted as $\vec{\beta}_0$ and $\vec{\beta}$, respectively. The projections are no longer unit vectors; the vector $\vec{\beta}_0$ has a magnitude equal to $\sin \theta_r$, while the vector $\vec{\beta}$ has a magnitude equal to $\sin \theta_s$, where $\theta_r$ and $\theta_s$ denote the angle between the normal vector and the specularly reflected beam and the scattered beam, respectively. The scatter vector is denoted $\hat{x}$, and as $|\vec{x}|$ tends to zero, the scattered and specular vectors become the same. A scattering model such as this is commonly implemented in commercially available ray tracing programs, such as ZEMAX® from ZEMAX Development Corporation.

Figure 7:
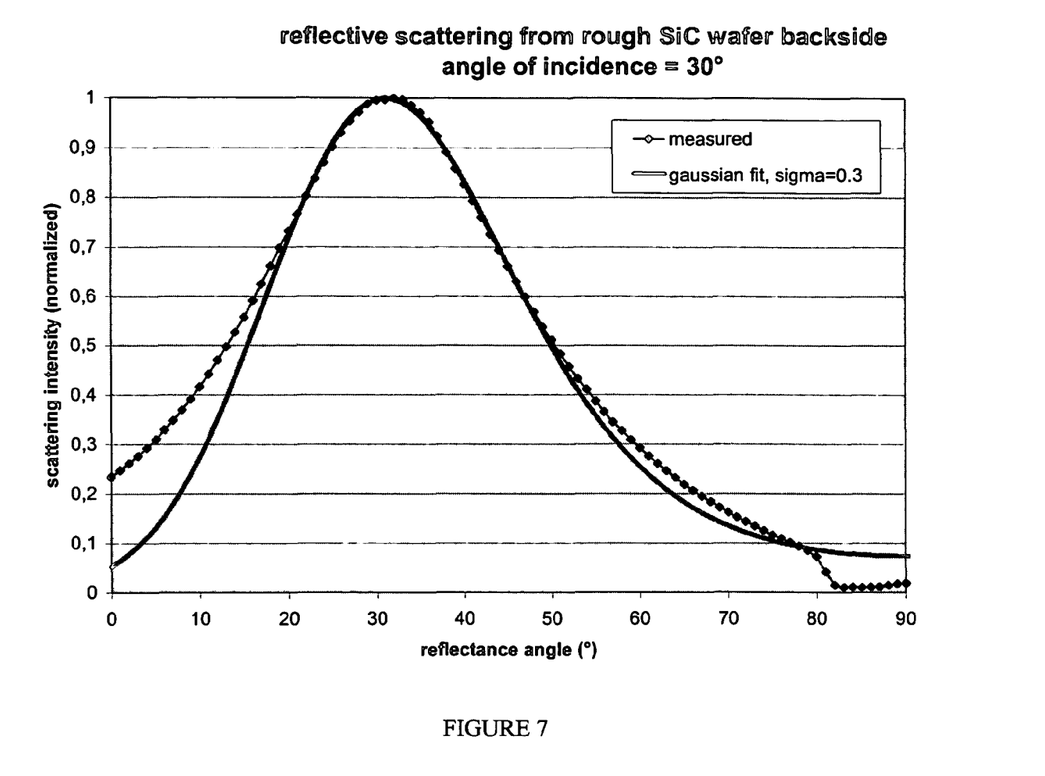
FIG. 7 is a graph of scattering data for a roughened SiC substrate having a scattering factor of about 0.30.

The scattering data from the roughened surface can be determined from the angularly resolved intensity distribution of light scattered from the roughened surface. For example, FIG. 7 shows measured scattering data (dots and black line) from a roughened SiC surface for an incident angle of 30 degrees and the Gaussian fit (grey line) for a scattering factor of 0.3.

A number of embodiments have been described. Nevertheless, it will be understood that various modifications may be made without departing from the spirit and scope of the invention. For example, the invention naturally is not limited to the exemplary embodiments by the exemplary description made with reference to those embodiments. Rather, the invention encompasses any novel feature and any combination of features, particularly including any combination of individual features of the various claims or of the various exemplary embodiments, even if the feature or combination concerned is itself not mentioned explicitly in the claims or the exemplary embodiments. Accordingly, other embodiments are within the scope of the following claims.

What is claimed is:

1. An electromagnetic radiation generating semiconductor chip comprising:
    a first set of layers including a radioparent, electrically conductive growth substrate and a semiconductor layer sequence for generating electromagnetic radiation grown on a first main face of the growth substrate;
    a radiation-diffusing structure provided on a main face of the first set of layers, wherein the electromagnetic radiation emitted to the radiation-diffusing structure from said semiconductor layer sequence is scattered by said radiation-diffusing structure; and
    a layer or layer sequence reflective to the electromagnetic radiation applied to said radiation-diffusing structure.

2. The electromagnetic radiation generating semiconductor chip as specified in claim 1 wherein the main face of the first set of layers is a second main face of said growth substrate remote from said semiconductor layer sequence.

3. The semiconductor chip as specified in claim 2, wherein said growth substrate has a thickness that is between 50 μm inclusive and 150 μm inclusive.

4. The semiconductor chip as specified in claim 3, wherein said growth substrate has a thickness of about 100 μm.

5. The semiconductor chip as specified in claim 2, wherein said electromagnetic radiation generating semiconductor layer sequence is based on nitride III/V compound semiconductor material.

6. The semiconductor chip as specified in claim 5, wherein said electromagnetic radiation generating semiconductor layer sequence contains at least one semiconductor layer based on $In_xAl_yGa_{1-x-y}N$, where $0 \leq x \leq 1$, $0 \leq y \leq 1$ and $x+y \leq 1$.

7. The semiconductor chip as specified in claim 2, wherein said growth substrate is a SiC growth substrate implanted with a nitrogen dopant adjacent said layer or layer sequence reflective to the electromagnetic radiation to increase the majority charge carrier density and provide increased electrical conductivity.

8. The semiconductor chip as specified in claim 2, wherein said layer or layer sequence reflective to the electromagnetic radiation contains a metal that is reflective to the electromagnetic radiation emitted by said semiconductor layer sequence.

9. The semiconductor chip as specified in claim 8, wherein said metal contains one or more of Al, Ag, Ru, and Ir.

10. The semiconductor chip as specified in claim 2, wherein the radiation-diffusing structure has a pyramid structure.

11. The semiconductor chip as specified in claim 2, wherein a radiation-diffusing structure is also provided on a side opposite to the side on which said reflective layer or layer sequence is disposed.

12. The semiconductor chip as specified in claim 2, wherein a second radiation-diffusing structure is provided on a front side of the first set of layers, the front side facing away from said reflective layer or layer sequence and configured for coupling out electromagnetic radiation during operation.

13. The semiconductor chip as specified in claim 2, further comprising a transparent or semitransparent, electrically conductive front-side contact layer disposed on a front side of the first set of layers, said front side being opposite to said reflective layer or layer sequence and configured for coupling out electromagnetic radiation operation.

14. The semiconductor chip as specified in claim 2, wherein the growth substrate comprises SiC.

15. The semiconductor chip as specified in claim 2, wherein the semiconductor chip comprises an electrical contact layer, wherein the electrical contact layer is arranged between the radiation-diffusing structure and the layer or layer sequence reflective to the electromagnetic radiation and is covered by the reflective layer or layer sequence.

16. The semiconductor chip as specified in claim 15, wherein the electrical contact layer comprises at least one element of the group consisting of spaced-apart lands, individual dots, and a lattice-like structure, or the electrical contact layer is a thin, semitransparent contact layer.

17. The semiconductor chip as specified in claim 15, wherein the electrical contact layer is configured to provide an electrical contact to the semiconductor layer sequence through the electrically conductive growth substrate.

18. The semiconductor chip as specified in claim 2, wherein the radiation-diffusing structure produces a scattering factor higher than 0.25.

19. The electromagnetic radiation generating semiconductor chip as specified in claim 1 wherein the main face of the first set of layers is a main face of said semiconductor layer sequence remote from said growth substrate.

20. The semiconductor chip as specified in claim 19, wherein the growth substrate comprises SiC.

21. The semiconductor chip as specified in claim 19, wherein the semiconductor chip comprises an electrical contact layer, wherein the electrical contact layer is arranged between the radiation-diffusing structure and the layer or layer sequence reflective to the electromagnetic radiation and is covered by the reflective layer or layer sequence.

22. The semiconductor chip as specified in claim 21, wherein the electrical contact layer comprises at least one element of the group consisting of spaced-apart lands, individual dots, and a lattice-like structure, or the electrical contact layer is a thin, semitransparent contact layer.

23. The semiconductor chip as specified in claim 21, wherein the electrical contact layer is configured to provide an electrical contact to the semiconductor layer sequence through the electrically conductive growth substrate.

24. The semiconductor chip as specified in claim 19, wherein the radiation-diffusing structure produces a scattering factor higher than 0.25.

25. The semiconductor chip as specified in claim 19, wherein said growth substrate has a thickness that is between 50 µm inclusive and 150 µm inclusive.

26. The semiconductor chip as specified in claim 19, wherein said electromagnetic radiation generating semiconductor layer sequence is based on nitride III/V compound semiconductor material.

27. The semiconductor chip as specified in claim 26, wherein said electromagnetic radiation generating semiconductor layer sequence contains at least one semiconductor layer based on $In_xAl_yGa_{1-x-y}N$, where $0 \leq x \leq 1$, $0 \leq y \leq 1$ and $x+y \leq 1$.

28. The semiconductor chip as specified in claim 19, wherein said growth substrate is a SiC growth substrate implanted with a nitrogen dopant adjacent said reflective layer to increase the majority charge carrier density and provide increased electrical conductivity.

29. The semiconductor chip as specified in claim 19, wherein said reflective layer contains a metal that is reflective to the electromagnetic radiation emitted by said semiconductor layer sequence.

30. The semiconductor chip as specified in claim 29, wherein said metal contains one or more of Al, Ag, Ru, and Ir.

31. The semiconductor chip of claim 1, wherein the radiation-diffusing structure has a diffuse roughening.

32. A light-emitting assembly comprising:
a housing; and
the semiconductor chip of claim 1 mounted to a chip mounting surface of the housing.

33. The semiconductor chip as specified in claim 1, wherein a semitransparent conductive layer is placed between the first set of layers and the reflective layer.

34. The semiconductor chip as specified in claim 32, wherein the thickness of the semitransparent conductive layer is less than 10 nm.

* * * * *

UNITED STATES PATENT AND TRADEMARK OFFICE
CERTIFICATE OF CORRECTION

PATENT NO. : 8,330,175 B2  
APPLICATION NO. : 11/154292  
DATED : December 11, 2012  
INVENTOR(S) : Dominik Eisert et al.

Page 1 of 1

It is certified that error appears in the above-identified patent and that said Letters Patent is hereby corrected as shown below:

In Claim 13, column 9, line 40, after "radiation" and insert -- during --.

Signed and Sealed this  
Nineteenth Day of March, 2013

Teresa Stanek Rea  
*Acting Director of the United States Patent and Trademark Office*

UNITED STATES PATENT AND TRADEMARK OFFICE
CERTIFICATE OF CORRECTION

PATENT NO. : 8,330,175 B2
APPLICATION NO. : 11/154292
DATED : December 11, 2012
INVENTOR(S) : Dominik Eisert et al.

It is certified that error appears in the above-identified patent and that said Letters Patent is hereby corrected as shown below:

In the Claims:

In Claim 34, column 10, line 57, delete "claim 32" and insert -- claim 33 --.

Signed and Sealed this
Sixth Day of August, 2013

Teresa Stanek Rea
*Acting Director of the United States Patent and Trademark Office*